United States Patent [19]

Greier et al.

[11] Patent Number: 5,625,645
[45] Date of Patent: Apr. 29, 1997

[54] DIFFERENTIAL PULSE ENCODING AND DECODING FOR BINARY DATA TRANSMISSIONS

[75] Inventors: Paul F. Greier, Carmel; Lawrence S. Mok, Brewster, both of N.Y.

[73] Assignee: International Business Machines Corporation, Armonk, N.Y.

[21] Appl. No.: 506,625

[22] Filed: Jul. 25, 1995

[51] Int. Cl.⁶ .................................................. H04B 4/06
[52] U.S. Cl. ........................ 375/276; 327/335; 375/289
[58] Field of Search ..................... 375/242, 244, 375/272, 274, 289, 288, 303, 305, 334, 336, 276; 329/300, 315, 318–320; 332/100, 117; 341/53, 54, 76, 77; 327/335; 364/732

[56] References Cited

U.S. PATENT DOCUMENTS

| 3,209,261 | 9/1965 | Critchlow | 327/335 |
|---|---|---|---|
| 5,287,516 | 2/1994 | Schaub | 375/272 |
| 5,412,687 | 5/1995 | Sutton et al. | 375/202 |

*Primary Examiner*—Tesfaldet Bocure
*Assistant Examiner*—Bryan Webster
*Attorney, Agent, or Firm*—Daniel P. Morris

[57] ABSTRACT

A differential pulse encoding and decoding approach for binary data transmissions, such as binary frequency shift keying (BFSK) data transmissions, for sending and recovering a serial, binary digital data stream by differentiating the pulses thereof. A method and system are disclosed for transmitting from a transmitter to a receiver a digital data signal containing a stream of binary data bits having a first high value and a second low value. At the transmitter, the digital signal is transformed into a differential signal which contains pulses corresponding to transitions between the first and second values. The digital signal is transformed into the differential signal by an encoder which can be a differentiator circuit or an RC high-pass filter circuit. If frequency spectrum is a concern, a low-pass filter can filter the output of the encoder. The differential signal is then transmitted, and received by the receiver which reconstructs the original digital signal therefrom. The transmission of the differential signal can be by a transmission cable or by an FM transmitter and receiver. At the receiver, the digital signal is reconstructed from the differential signal by a decoder circuit which functions to produce a high voltage output signal when the input signal is higher than a reference high voltage, and a low voltage output signal when the input signal is lower than a reference low voltage. A low-pass filter can also filter the input to the decoder circuit.

21 Claims, 3 Drawing Sheets

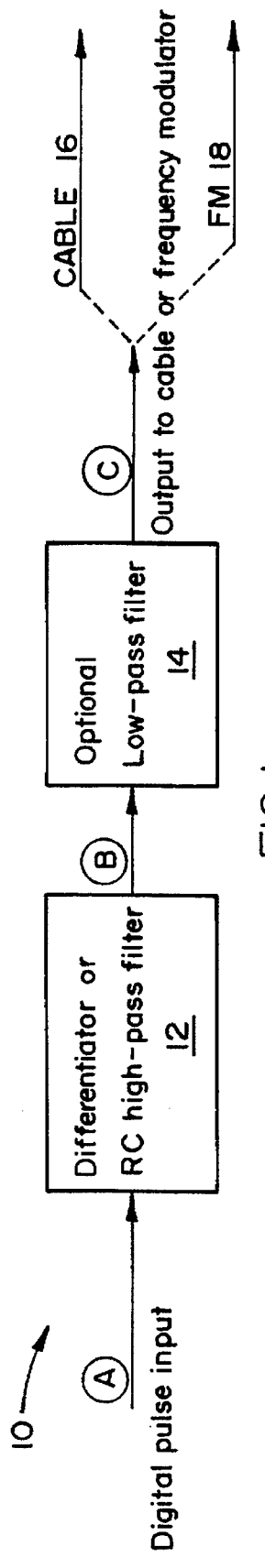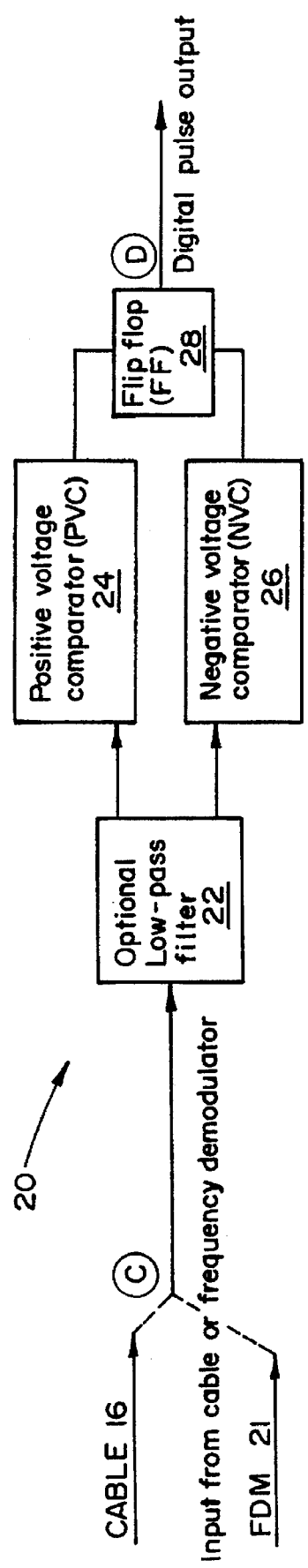

DIFFERENTIAL PULSE ENCODING AND DECODING FOR BINARY DATA TRANSMISSIONS

BACKGROUND OF THE INVENTION

1. Field of the Invention

The present invention relates generally to differential pulse encoding and decoding approach for binary data transmissions. More particularly, the subject invention pertains to methods and circuits for differential pulse encoding and decoding of data for binary data transmissions, such as binary frequency shift keying (BFSK) data transmissions, for sending and recovering a serial, binary digital data stream by differentiating the pulses thereof.

2. Discussion of the Prior Art

Problems exist in the prior art with respect to modulating a binary digital data stream directly onto the carrier frequency of a frequency modulation transmitter, which is generally referred to as Binary Frequency Shift Keying (BFSK). Several derivatives of BFSK are also known such as Minimum Shift Keying (MSK) and Gaussian Minimum Shift Keying (GMSK). These derivatives have a narrower spectrum than that of the basic BFSK. However, none of these approaches has solved an intrinsic problem of BFSK, which is that the data stream must not stay at a high level for a long period of time. In other words, the data stream must be randomized before being forwarded to the frequency modulator. Sometimes the data stream cannot be randomized as desired, particularly if it has many contiguous bits at one logic level, which results in higher data transmission errors. The cause of this problem is that most modern FM transmitters use a Phase Locked Loop (PLL) to maintain the carrier frequency at a preset frequency. Any deviations of the carrier frequency therefrom cause the PLL to function to adjust the frequency back to the preset frequency, which means that the PLL essentially works against the BFSK data transmission arrangement. Because a time gap exists in the PLL between the time when the PLL detects a frequency change and the time it starts to correct the frequency, BFSK can still be used effectively provided that the bit logic level changes faster than the time gap. The method and circuit of the present invention totally solves this intrinsic problem of BFSK data transmissions.

The method and circuit of the present invention also solves a problem with electromagnetic interference encountered during transmitting a binary data stream using a cable medium. In this case, the normal rectangular data pulses create higher order harmonics which in turn produce high levels of electromagnetic noise. The present invention converts the rectangular data pulses into a stream of sine wave like pulses which consists of very few high-order harmonics.

SUMMARY OF THE INVENTION

Accordingly, it is a primary object of the present invention to provide a differential pulse encoding and decoding approach for binary data transmissions.

A secondary object of the present invention is to provide sine wave like pulses for transmitting binary data streams using a cable medium.

A further object of the subject invention is the provision of methods and circuits for differential pulse encoding and decoding of data for binary data transmissions, such as binary frequency shift keying (BFSK) data transmissions, for sending and recovering a serial, binary digital data stream by differentiating the pulses thereof.

In accordance with the teachings herein, the present invention provides a method and system for transmitting from a transmitter to a receiver a digital data signal containing a stream of binary data bits having a first high value and a second low value. At the transmitter, the digital signal is transformed into a differential signal which contains pulses corresponding to transitions between the first and second values. The differential signal is then transmitted, and received by the receiver which reconstructs the original digital signal therefrom.

In greater detail, the transmission of the differential signal can be by a transmission cable or by an FM transmitter and receiver. In the case of a transmission cable, a modulated carrier wave is not required. However, transmitting the binary data pulses directly is disadvantageous as the binary data pulses create higher order harmonics with associated high levels of electromagnetic noise. The sine wave like pulses developed by the present invention have very few high order harmonics and accordingly mitigate this problem.

The digital signal is transformed into the differential signal by an encoder which can be a differentiator circuit or an RC high-pass filter circuit. If frequency spectrum is a concern, a low-pass filter can filter the output of the differentiator circuit.

At the receiver, the digital signal is reconstructed from the differential signal by a decoder circuit which functions to produce a high voltage output signal when the input signal is higher than a reference high voltage, and a low voltage output signal when the input signal is lower than a reference low voltage. In one embodiment, the decoder circuit comprises a positive voltage comparator in parallel with a negative voltage comparator, wherein a flip flop is driven by the positive and negative voltage comparators. In this arrangement, when the signal voltage is greater than a preset positive voltage, the positive voltage comparator sets the output of the flip flop to a high voltage, and when the negative voltage comparator detects a signal voltage less than a preset negative voltage, it resets the flip flop to a low voltage output. A low-pass filter can also filter the inputs to the positive and negative voltage comparators.

BRIEF DESCRIPTION OF THE DRAWINGS

The foregoing objects and advantages of the present invention for a differential pulse encoding and decoding approach for binary data transmissions may be more readily understood by one skilled in the art with reference being had to the following detailed description of several preferred embodiments thereof, taken in conjunction with the accompanying drawings wherein like elements are designated by identical reference numerals throughout the several views, and in which:

FIG. 1 illustrates a block diagram of an exemplary embodiment of a differential pulse encoder;

FIG. 2 is a block diagram of an exemplary embodiment of a differential pulse decoder;

DETAILED DESCRIPTION OF THE DRAWINGS

Figure 3:
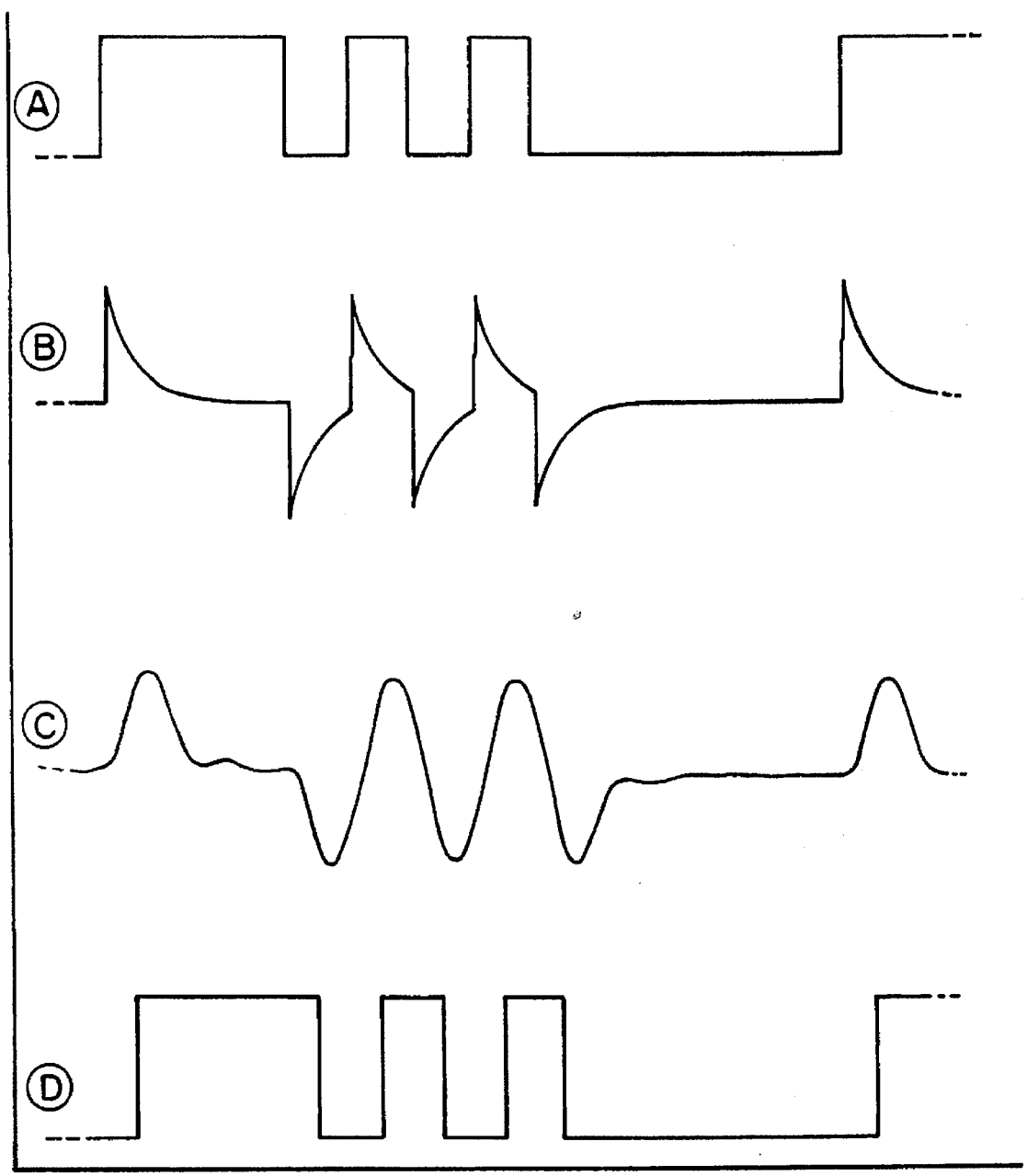
FIG. 3 illustrates exemplary waveforms of the digital data streams at various stages in the circuits which are useful in explaining the operations of the circuits of FIGS. 1 and 2.

Referring to the drawings in detail, FIGS. 1 and 2 illustrate respectively block diagrams of exemplary embodiments of a differential pulse encoder 10 and a differential pulse decoder 20. FIG. 3 illustrates exemplary waveforms A through D of the digital data streams at various stages in the circuits which are useful in explaining the operation of the circuits of FIGS. 1 and 2.

Referring to FIG. 1, a typical data, stream A, as shown in FIG. 3, is directed to a circuit 12, which can be a differentiator circuit or resistor-capacitor type of high-pass filter circuit with a cut off frequency appropriate to the data rate. The output waveform of this stage is shown as waveform B in FIG. 3. An optional low-pass filter 14 filters this signal and filters out or shaves off the high-frequency portion of the spectrum, as illustrated by waveform C in FIG. 3. If frequency spectrum is not a concern, then low-pass filter 14 is not required.

The output signal of the encoder, waveform C in FIG. 3, is then directed to a transmission cable 16 or to the frequency modulator 18 of an FM transmitter. Sometimes in the cable case, waveform C can be used directly without further frequency modulation, which is referred to as baseband transmission. In either case, the output waveform from the encoder 10 does not have a high voltage level maintained for longer than one data bit time in any time period.

At the receiver, the received signal from the cable 16 or from the frequency demodulator 21 of an FM receiver is directed to a decoder 20 as illustrated in FIG. 2, which consists of an optional low-pass filter 22, a positive voltage comparator (PVC) 24, a negative comparator (NVC) 26, and a flip flop (FF) 28, connected as shown.

The combined function of the PVC 24, NVC 26 and FF 28 circuits is to produce at its output a high voltage output when the input signal is higher than a reference high voltage, and a low voltage output when the input signal is lower than a reference low voltage.

In operation, when the signal voltage is greater than a preset positive voltage, the PVC 24 sets the FF 28 to a high voltage. When the NVC 26 detects a voltage which is less than a preset negative voltage, it resets the FF 28 to a low voltage. The output of the FF 28 is then the recovered data stream, as shown by waveform D in FIG. 3. Note that the recovered data stream D is exactly like the original source data stream A except for being slightly delayed in time.

Figure 4:
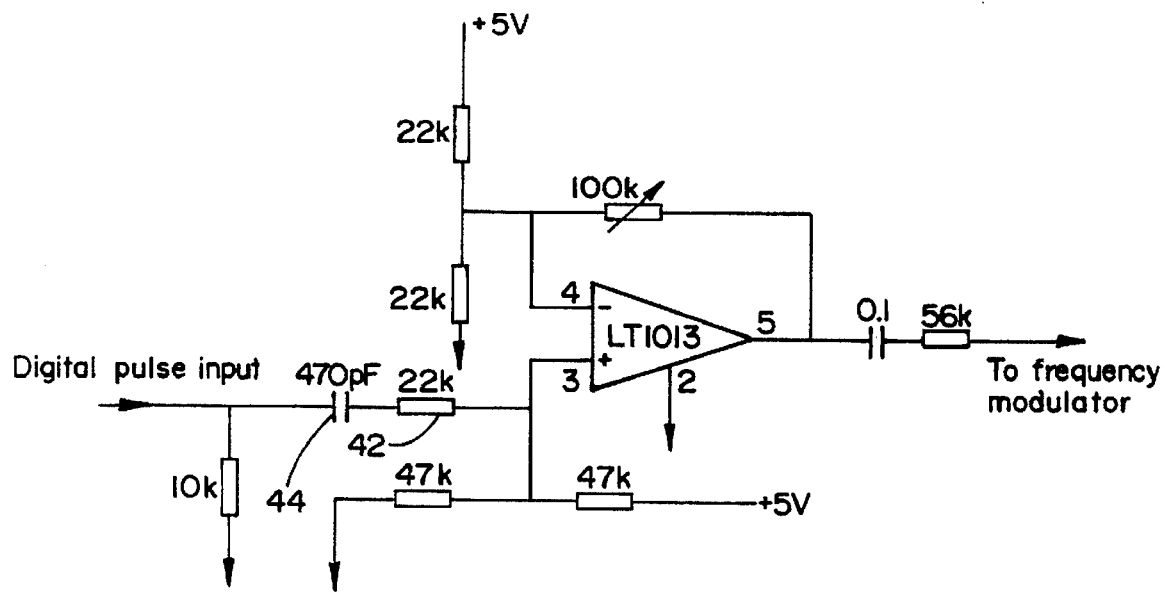
FIGS. 4 and 5 illustrate respectively detailed circuit diagrams for designed embodiments of a differential pulse encoder and a differential pulse encoder which have been built and successfully tested in which the optional low-pass filters have not been utilized.
Figure 5:
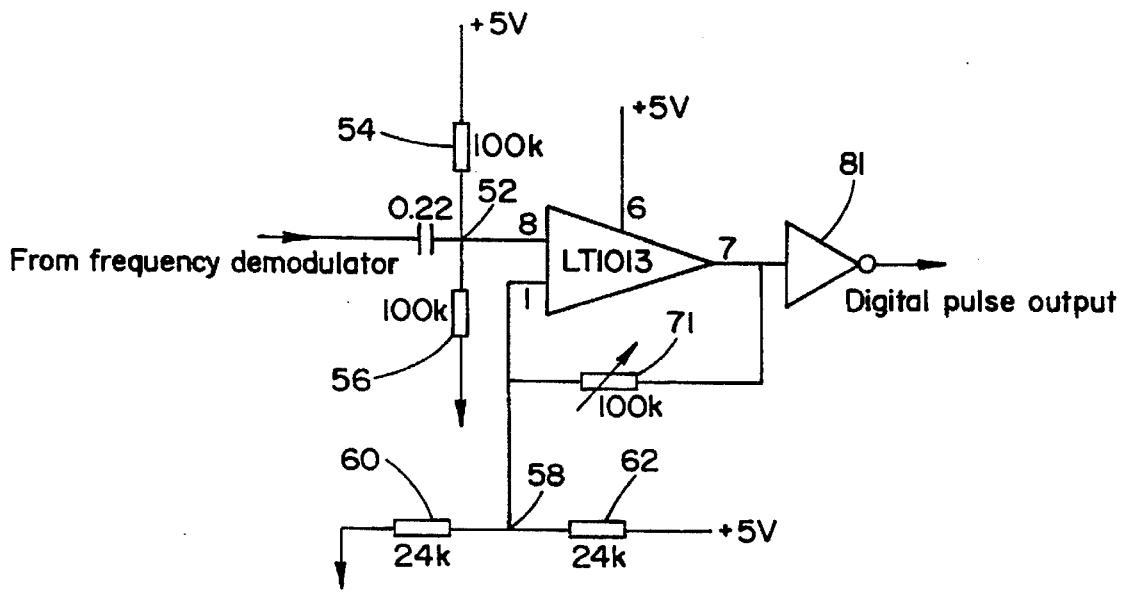

FIGS. 4 and 5 illustrate respectively detailed circuit diagrams of designed embodiments of a differential pulse encoder and a differential pulse decoder which have been built and successfully tested in which the optional low-pass filters are not implemented. Part of the decoder circuit is taken and modified from a book titled *Operational Amplifiers* by I. E. Shepherd.

The encoder circuit 10 of FIG. 4 illustrates the driving voltages, resistive values, and capacitive values of the elements of the circuit, and includes an RC high-pass filter comprised of a 22K resistor 42 and a 470 pF capacitor 44. The LT1013 circuit chip is connected as shown to function as an amplifier and limiter to amplify and limit the amplitude of the output of the RC high-pass filter.

The decoder circuit 20 of FIG. 5 also illustrates the driving voltages, the resistive values, and the capacitive values of the elements of the circuit, and includes a circuit which basically functions to produce at its output a high voltage output when the input signal is higher than a reference high voltage, and a low voltage output when the input signal is lower than a reference low voltage. The reference high and low voltages are produced at nodes 52 and 58 by the 100K resistors 54 and 56, and the 24K resistors 60 and 62 as voltage divider circuits. The reference high and low voltages can be adjusted by the potentiometer 71. The LT1013 circuit chip is connected as shown to function as a differential amplifier, to produce a high voltage output when the input signal is lower than the reference low voltage, and a low voltage output when the input signal is higher than the reference high voltage. An inverter 81 is connected to the output of the LT1013 circuit chip to invert the digital signal polarity. The output signal from the inverter 81 will have the same polarity of the data stream inputting to the encoder 10. Alternatively, an inverter can be placed in front of the encoder 10. Accordingly, the circuit of FIG. 5 produces the equivalent function of the PVC 24, NVC 26 and FF 28 circuits of FIG. 2, but in an entirely different circuit. Obviously, other circuits which produce the same function could be used in alternative embodiments of the present invention.

The present invention provides circuits and methods for transmitting binary digital data reliably using a hard wire cable or an FM radio transceiver.

While several embodiments and variations of the present invention for differential pulse encoding and decoding for binary data transmissions are described in detail herein, it should be apparent that the disclosure and teachings of the present invention will suggest many alternative designs to those skilled in the art.

What is claimed is:

1. A method for transmitting a binary data stream signal containing a stream of binary data having a first high value and a second low value from a transmitter to a receiver, comprising the steps of:

a. transforming the binary data stream directly to a differential pulse stream signal having information only about when the binary data stream changes from a high value to a low value and changes from a low value to a high value, comprised of a stream of one half cycle pulses wherein a one half cycle pulse above a given high threshold represents a transition in a first direction between a low value and a high value, and a one half cycle pulse below a given low threshold represents a transition in a second direction, opposite to the first direction, between a low value and a high value;

b. transmitting the differential pulse stream signal as a transmitted signal;

c. receiving the transmitted differential pulse stream signal; and d. reconstructing the binary data stream signal from the transmitted and received differential pulse stream signal.

2. A method as claimed in claim 1, wherein in the transforming step, the differential pulse stream comprises a stream of one half cycle pulses wherein a one half cycle pulse above a given high threshold represents a transition from a low value to a high value, and a one half cycle pulse below a given low threshold represents a transition from a high value to a low value.

3. A method as claimed in claim 1, wherein the transforming step is performed by an encoder.

4. A method as claimed in claim 3, wherein the transforming step is performed by a differentiator circuit in the encoder.

5. A method as claimed in claim 3, wherein the transforming step is performed by an RC high-pass filter in the encoder.

6. A method as claimed in claim 3, further including the step of low-pass filtering the differential-pulse stream signal.

7. A method as claimed in claim 1, wherein the reconstructing step is performed by a decoder circuit which produces at its output a high voltage output when the input signal is higher than a reference high voltage, and a low voltage output when the input signal is lower than a reference low voltage.

8. A method as claimed in claim 7, wherein the reconstructing step is performed by a positive voltage comparator in parallel with a negative voltage comparator, wherein a flip flop is driven by the positive and negative voltage comparators in the decoder, such that when the signal voltage is greater than a preset positive voltage, the positive voltage comparator sets the flip flop to a high voltage output, and when the negative voltage comparator detects a voltage which is less than a preset negative voltage, it resets the flip flop to a low voltage output.

9. A method as claimed in claim 8, further including the step of low-pass filtering the inputs to the positive and negative voltage comparators.

10. A method as claimed in claim 1, wherein the transmitting step is performed by a transmission cable, and wherein the differential pulse stream signal consists of a stream of sinewave like pulses having few higher order harmonics and associated electromagnetic noise.

11. A method as claimed in claim 1, wherein the transmitting step is performed by an FM transmitter.

12. A system for transmitting a binary data stream signal containing a stream of binary data having a first high value and a second low value from a transmitter to a receiver, comprising:

a. an encoder means for transforming the binary data stream directly to a differential pulse stream signal having information only about when the binary data stream changes from a high value to a low value and changes from a low value to a high value, comprised of a stream of one half cycle pulses wherein a one half cycle pulse above a given high threshold represents a transition in a first direction between a low value and a high value, and a one half cycle pulse below a given low threshold represents a transition in a second direction, opposite to the first direction, between a low value and a high value;

b. a transmitter for transmitting the differential pulse stream signal as a transmitted signal;

c. a receiver for receiving the transmitted differential pulse stream signal; and d. a decoder for reconstructing the binary data stream signal from the transmitted pulse stream signal.

13. A system as claimed in claim 12, wherein the encoder means transforms the binary data stream directly to a differential pulse stream signal comprised of a stream of one half cycle pulses wherein a one half cycle pulse above a given high threshold represents a transition from a low value to a high value, and a one half cycle pulse below a given low threshold represents a transition from a high value to a low value.

14. A system as claimed in claim 12, wherein the decoder produces at its output a high voltage output when the input signal is higher than a reference high voltage, and a low voltage output when the input signal is lower than a reference low voltage.

15. A system as claimed in claim 12, wherein the encoder comprises a differentiator circuit.

16. A system as claimed in claim 12, wherein the encoder comprises an RC high-pass filter circuit.

17. A system as claimed in claim 12, also comprising a low-pass filter for filtering the differential pulse stream signal.

18. A system as claimed in claim 14, wherein the decoder comprises a positive voltage comparator connected in parallel with a negative voltage comparator, amd wherein a flip flop is set and reset by the positive and negative voltage comparators, wherein when the signal voltage is greater than a preset positive voltage, the positive voltage comparator sets the flip flop output to a high voltage, and when the negative voltage comparator detects a voltage which is less than a preset negative voltage, it resets the flip flop output to a low voltage.

19. A system as claimed in claim 18, further including a low-pass filter coupled to the inputs to the positive and negative voltage comparators.

20. A system as claimed in claim 12, wherein the transmitter and receiver are coupled by a transmission cable.

21. A system as claimed in claim 12, wherein the transmitter comprises an FM transmitter and the receiver comprises an FM receiver.

\* \* \* \* \*